(12) United States Patent
Quarre

(10) Patent No.: US 7,278,268 B2
(45) Date of Patent: Oct. 9, 2007

(54) THERMALLY EFFICIENT CCD CAMERA HOUSING

(75) Inventor: Steven C. Quarre, Woodinville, WA (US)

(73) Assignee: Applied Precision, LLC, Issaquah, WA (US)

( * ) Notice: Subject to any disclaimer, the term of this patent is extended or adjusted under 35 U.S.C. 154(b) by 227 days.

(21) Appl. No.: 10/728,197

(22) Filed: Dec. 3, 2003

(65) Prior Publication Data

US 2004/0195676 A1 Oct. 7, 2004

Related U.S. Application Data

(60) Provisional application No. 60/430,988, filed on Dec. 4, 2002.

(51) Int. Cl.
*F25B 21/02* (2006.01)
*F25D 23/12* (2006.01)

(52) U.S. Cl. .................................... 62/3.2; 62/259.2

(58) Field of Classification Search ............ 62/3.2–3.7
See application file for complete search history.

(56) References Cited

U.S. PATENT DOCUMENTS

| | | | | |
|---|---|---|---|---|
| 4,253,515 A | * | 3/1981 | Swiatosz | ............ 165/61 |
| 4,947,648 A | * | 8/1990 | Harwell et al. | ............... 62/3.2 |
| 5,254,178 A | * | 10/1993 | Yamada et al. | ............ 136/204 |
| 5,332,031 A | * | 7/1994 | Kiga | ............................ 165/86 |
| 5,724,818 A | * | 3/1998 | Iwata et al. | ................. 62/3.7 |
| 2003/0019216 A1 | * | 1/2003 | Itakura et al. | ............... 62/3.7 |
| 2003/0097845 A1 | * | 5/2003 | Saunders et al. | |

OTHER PUBLICATIONS

Steve J. Noll, Peltier Device Information Directory [web address: http://www.peltier-info.com/info.html], viewed May 25, 2006.*

* cited by examiner

*Primary Examiner*—Cheryl Tyler
*Assistant Examiner*—Michael J. Early
(74) *Attorney, Agent, or Firm*—Pillsbury Winthrop Shaw Pittman LLP

(57) ABSTRACT

A system and method of cooling a CCD camera may employ a composite material housing design that allows the cold side of a TEC to be mounted relatively close to the CCD and the hot side of the TEC to be isolated from the housing cavity in which the CCD resides. An efficient heat transfer path may facilitate cooling the CCD to a predetermined or selected operating temperature and isolate the CCD from the heat loads generated by operation the TEC.

38 Claims, 3 Drawing Sheets

THERMALLY EFFICIENT CCD CAMERA HOUSING

CROSS-REFERENCE TO RELATED APPLICATIONS

The present application claims the benefit of U.S. provisional application Ser. No. 60/430,988, filed Dec. 4, 2002, entitled "THERMALLY EFFICIENT CCD CAMERA HOUSING."

FIELD OF THE INVENTION

Aspects of the present invention relate generally to cooled CCD cameras, and more particularly to a thermally efficient CCD camera housing.

DESCRIPTION OF THE RELATED ART

The design of low light detection charge-coupled device (CCD) cameras typically requires the CCD to be operating at low temperatures (e.g., from about 0° C. to about −40° C.). To achieve such low operating temperatures, typical systems employ a thermoelectric cooling (TEC) component coupled in some manner to the CCD.

A conventional TEC has both a cold surface and a hot surface; the hot surface (operably coupled to a heat sink) generally must be maintained at or near a predetermined or target temperature to ensure that the cold surface (operably coupled to the CCD) may provide optimum effectiveness with respect to cooling the CCD. Even when the TEC is operating as intended within the appropriate parameters, conventional TEC design is relatively inefficient. For example, to maintain a desired CCD operating temperature, it may be necessary for a conventional system to supply as much as 25 Watts of energy to the TEC to cool an ambient heat load of 4 Watts. In this case, the total amount of heat that must be removed from the system may be expressed as:

4 Watts+25 Watts=29 Watts where 4 Watts represents the ambient load and 25 Watts represents the power input to the TEC necessary to provide the 4 Watts of ambient cooling.

Another requirement for a cooled CCD camera is that the environment around the CCD be maintained at very low moisture or relative humidity levels. At low operating temperatures, atmospheric or other moisture in or around the CCD housing may condense and freeze, causing imaging and reliability problems. Accordingly, CCD housings generally require or substantially benefit from an environmentally tight seal to prevent moisture contamination and attendant imaging difficulties. Additionally, a non-porous material is generally preferred for such CCD housings, which is why aluminum is a popular choice for these applications. Aluminum is also a good heat conductor, however, which means that an aluminum housing surrounding the CCD may not be effective in isolating the CCD from either ambient or TEC generated heat.

Conventional systems, therefore, are generally deficient at least with respect to the problem of transferring ambient heat loads and heat generated from the TEC away from the CCD without "re-circulating" such heat back into the proximity of the CCD. Additionally, as noted above, an environmentally tight seal around the CCD generally must be maintained to avoid moisture build-up on the CCD.

In an attempt to overcome some of the above-noted deficiencies, some cooled CCD system designs mount the TEC physically away from the CCD and transfer heat from the CCD via a relatively long coupling mechanism interposed between the CCD and the TEC. This strategy helps to position any heat generated by the TEC at a desired distance from the CCD, and thus to isolate the CCD from that particular heat source. On the other hand, this arrangement generally results in inefficient heat transfer between the CCD and the cold side of the TEC; in many cases, inefficient heat transfer characteristics are caused by an increased thermal resistance associated with the elongated coupling mechanism. Thermal resistance increases at every interface between coupling mechanism components, for example, and is also directly related to the distance over which the heat travels. Accordingly, for a given TEC, cooling efficacy and efficiency generally vary directly with proximity to the CCD.

Alternatively, some CCD system designs mount the cold side of the TEC directly to the CCD; in these arrangements, the hot side of the TEC is generally mounted or attached directly to the CCD housing. As stated previously, the CCD housing is typically aluminum (which has high thermal conductivity) and generally serves as a heat sink for the TEC. On the other hand, since the hot side of the TEC is mounted to the CCD housing, these component arrangements generally result in undesirable heat transfer to the housing itself. As a consequence, since the CCD is also constructed from, or directly mounted on, the housing, the CCD cavity heats up as well.

Rising temperatures in the CCD cavity create more of an ambient heat load, which in turn results in decreased cooling efficiency for the CCD. The foregoing problem is compounded by the fact that heat tends to flow to the coldest regions of the system, which in this case may be the CCD. This scenario can also result in a temperature/time response curve relative to the CCD that is difficult to predict as the CCD initially cools, then starts to warm up when the camera housing becomes "heat saturated."

SUMMARY

Embodiments of the present invention overcome the above-mentioned and various other shortcomings of conventional technology, providing a thermally efficient housing for use in conjunction with a CCD camera or similar device. A system and method operative in accordance with some embodiments, for example, may employ a composite material housing design that allows the cold side of the TEC to be mounted relatively close to the CCD and the hot side of the TEC to be isolated from the housing cavity in which the CCD resides. An efficient heat transfer path may simultaneously facilitate cooling the CCD to a predetermined or selected operating temperature and isolate the CCD from the heat loads generated by operation the TEC.

In accordance with some embodiments, for example, a method of cooling a charge-coupled device comprises coupling the charge-coupled device to a cold side of a thermoelectric cooling device, coupling a hot side of the thermoelectric cooling device to a transfer plate, mounting the transfer plate to a thermal barrier, and coupling the transfer plate to a heat sink.

As set forth in more detail below, such a method may optionally further comprise interposing a spacer between the charge-coupled device and the cold side of the thermoelectric cooling device. In embodiments employing such a spacer, the interposing operation may comprise selectively dimensioning the spacer to maximize a surface area of contact between the charge-coupled device and the cold side of the thermoelectric cooling device. Additionally or alternatively, the interposing operation may comprise selectively dimensioning the spacer to position the hot side of the thermoelectric cooling device in a predetermined location relative to the charge-coupled device.

Some methods described herein may further comprise selectively applying a conformal coating to at least one of the transfer plate, the thermal barrier, and an interface between the transfer plate and the thermal barrier. In accordance with some embodiments, such selectively applying may comprise providing an environmentally tight moisture barrier with the conformal coating.

The foregoing methods may further comprise cooling the hot side of the thermoelectric cooling device. It will be appreciated that, in some instances, this cooling comprises transferring heat generated by the thermoelectric cooling device from the charge-coupled device.

The above-mentioned operation of mounting the transfer plate to a thermal barrier may comprise attaching the transfer plate to an epoxy laminate material, to a ceramic material, or to some other material or structural element which fails to conduct heat or does so only at a selected or predetermined rate. In accordance with some methods, this mounting operation comprises isolating heat generated by the thermoelectric cooling device from the charge-coupled device.

In accordance with other exemplary embodiments, an apparatus comprises a charge-coupled device mounted in a housing, a thermoelectric cooling device having a cold side and a hot side—the cold side coupled to the charge-coupled device—a heat sink, and a transfer plate coupling the hot side of the thermoelectric cooling device to the heat sink in a heat transfer relationship; the transfer plate mounted to a thermal barrier operative to prevent heat transfer between the thermoelectric cooling device and the housing.

The foregoing apparatus may optionally further comprise a spacer interposed between the charge-coupled device and the cold side of the thermoelectric cooling device. In some instances, such a spacer may be selectively dimensioned to maximize a surface area of contact between the charge-coupled device and the cold side of the thermoelectric cooling device. Additionally or alternatively, the spacer may be selectively dimensioned to position the hot side of the thermoelectric cooling device in a predetermined location relative to the charge-coupled device.

Some apparatus configured and operative in accordance with the present disclosure may further comprise a conformal coating applied to at least one of the transfer plate, the thermal barrier, and an interface between the transfer plate and the thermal barrier. Embodiments are described wherein such a conformal coating provides an environmentally tight moisture barrier for the coated structural elements, the interface therebetween, or both.

By way of example, the thermoelectric cooling device may be embodied in or comprise a Peltier cooling device. As set forth in more detail below, embodiments of the foregoing apparatus may be fabricated wherein the transfer plate is constructed of a heat-conducting metal. Similarly, an alternative is described wherein the spacer is constructed of a heat-conducting metal. Conversely, in the exemplary embodiments, the foregoing thermal barrier is constructed of an epoxy laminate material, a ceramic material, or some other material which fails to conduct heat or does so only at a selected or predetermined rate.

The foregoing and other aspects of various embodiments of the present invention will be apparent through examination of the following detailed description thereof in conjunction with the accompanying drawings.

DETAILED DESCRIPTION

Figure 2:
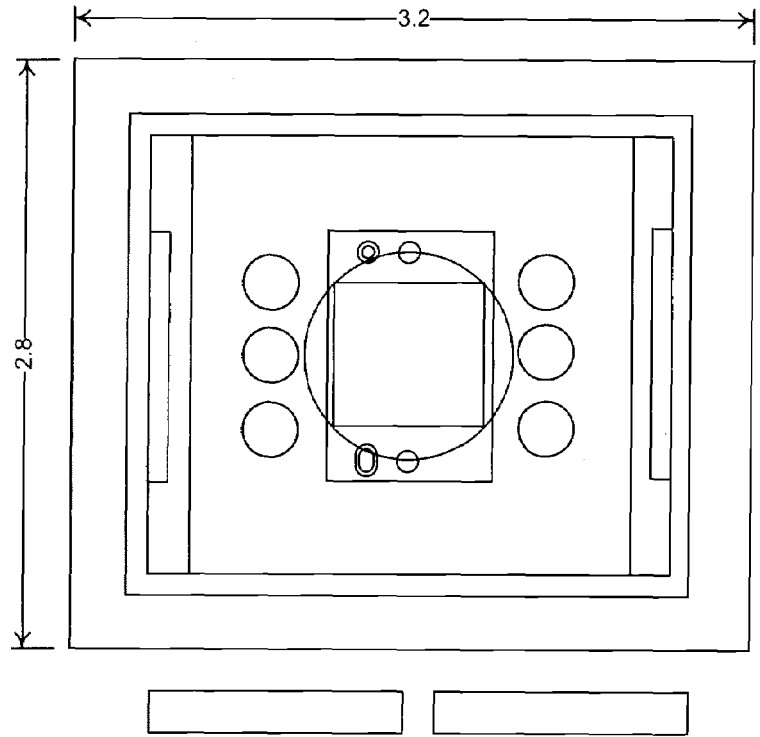
FIG. 2 is a simplified plan diagram of the embodiment of a CCD apparatus depicted in FIG. 1.
Figure 1:
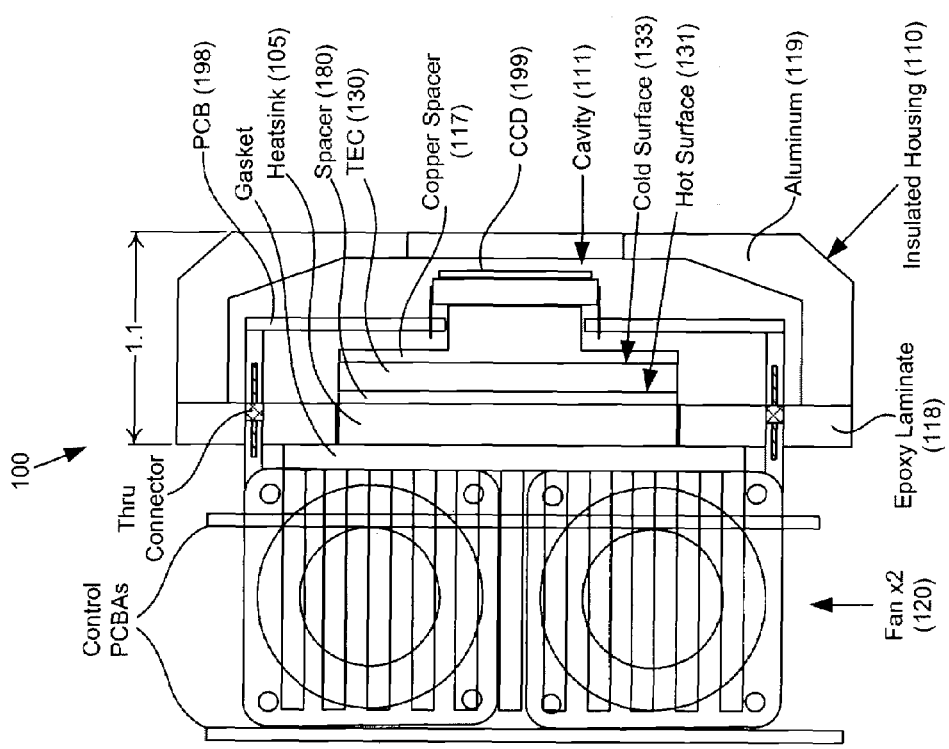
FIG. 1 is a simplified cross-sectional diagram illustrating one embodiment of a CCD apparatus.
Figure 3:
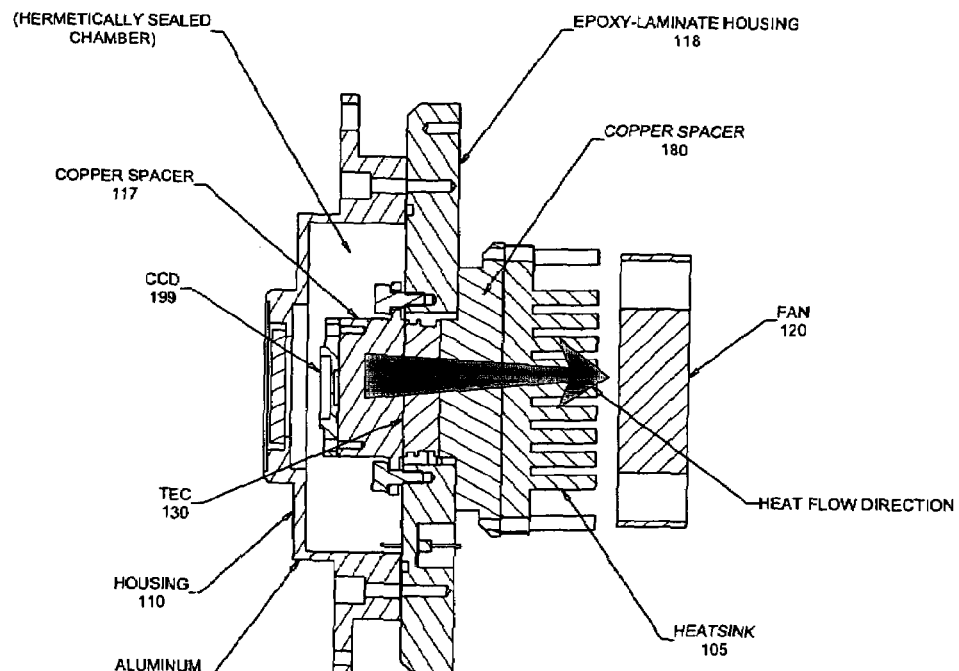
FIG. 3 is a simplified perspective diagram illustrating another embodiment of a CCD apparatus.

Turning now to the drawing figures, FIGS. 1 and 2 are simplified cross-sectional and plan diagrams, respectively, illustrating one embodiment of a CCD apparatus. FIG. 3 is a simplified perspective diagram illustrating another embodiment of a CCD apparatus. Apparatus 100 may generally comprise an insulated housing 110 defining a CCD cavity 111 in which a CCD camera 199 or other device, as well as attendant electronics or associated circuitry such as printed circuit board (PCB) 198, may be mounted. As indicated in FIGS. 1 and 3, apparatus 100 further comprises or incorporates a thermoelectric cooler (TEC) 130 operably coupled to CCD 199 as set forth in more detail below.

As is generally known and understood in the art, TEC 130 may be embodied in or comprise a Peltier cooling device, i.e., a solid-state heat pumping apparatus which operates on direct current (DC) power. TEC 130 may comprise a hot side 131 operably coupled to a heat sink 105 and a cold side 133 operably coupled to CCD 199.

As illustrated in FIGS. 1 and 3, some embodiments may further comprise a spacer or transfer plate 180 of a suitable size and material interposed between hot side 131 of TEC 130 and heat sink 105; it will be appreciated that transfer plate 180 may couple hot side 131 and heat sink 105 in a heat transfer relationship, i.e., conducting heat to heat sink 105 at a desired or predetermined rate. In that regard, transfer plate 180 may be fabricated of material having heat transfer characteristics suitable to accommodate cooling requirements of apparatus 100. In some embodiments, for example, transfer plate 180 may be fabricated of copper, brass, or aluminum, though other materials exhibiting appropriate heat transfer characteristics may also be used. The specific material selected for transfer plate 180 may be affected or influenced by the dimensions (such as overall size and thickness) of transfer plate 180 itself, the dimensions, shape, and efficiency of TEC 130, heat sink 105, or both, as well as other factors which may vary in accordance with design specifications of apparatus 100.

In the exemplary embodiments of FIGS. 1 and 3, a transfer plate or spacer 117 may be interposed between cold side 133 of TEC 130 and CCD 199. Spacer 117 may generally be configured and operative to couple cold side 133 and CCD 199 in a heat transfer relationship, i.e., spacer 117 may conduct heat away from CCD 199 during use. In that regard, material for spacer 117 may be selected in accordance with heat conductivity characteristics appropriate for system requirements. While spacer 117 may be copper, aluminum, or brass, for example, other materials having suitable heat transfer properties may also be used. As with transfer plate 180, the specific material selected for spacer 117 may be influenced by the dimensions of spacer 117 itself, the dimensions, shape, and efficiency of TEC 130, the dimensions and desired operating temperature of CCD 199, as well as other considerations which may vary as a function of the overall design characteristics of apparatus 100.

While spacer 117 generally lengthens the heat path by increasing the distance and material interfaces between CCD 199 and cold side 133 of TEC 130, spacer 117 may improve overall cooling efficiency and facilitate isolation of TEC 130, and heat generated thereby, from CCD 199 and cavity 111 substantially as set forth below. As best illustrated in FIG. 1, spacer 117 may project or extend through PCB 198 and simultaneously provide a large contact area with respect to cold side 133 of TEC 130. Additionally, spacer 117 may be dimensioned to facilitate or to allow positioning of hot side 131 of TEC 130 in a suitable location for mounting (through transfer plate 180) onto a thermally insulated structure, or "thermal barrier," such that heat generated by operation of TEC 130 is not re-circulated back to cavity 111, in general, nor to CCD 199, in particular. It will be appreciated that spacer 117 may be omitted in some embodiments where other components are suitably sized and dimensioned.

With respect to isolating heat generated by TEC 130, housing 110 may generally be embodied in or comprise three portions, each respectively constructed of different materials: a portion constructed of aluminum or a similar material (reference numeral 119, e.g., for enclosing CCD cavity 111); a portion constructed of copper or a similar material employed as a transfer plate 180 (e.g., for mounting TEC hot side 131); and a portion constructed of epoxy-glass laminate, ceramic, or a similar insulating material acting as a thermal barrier (reference numeral 118, e.g., for mounting transfer plate 180 and insulating or isolating CCD cavity 111 from the heat path). The copper and epoxy laminate are, respectively, highly efficient conductors and insulators of heat; combined as set forth herein, these materials may create an efficient thermal path for directing heat away from CCD 199.

During operation of apparatus 100, heat travels from CCD 199 and TEC 130 into transfer plate 180 (constructed of or comprising, for example, copper as noted above) and out of the camera system via heat sink 105 (attached or otherwise coupled to transfer plate 180 in a heat transfer relationship). As generally known in the art, the foregoing cooling process may be facilitated by air or other cooling gas circulated, for example, by one or more fans or fan assemblies 120. In accordance with the arrangement depicted in FIGS. 1 and 3, transfer plate 180 is attached or coupled to an epoxy-glass laminate thermal barrier 118, rather than to the aluminum portion 119 of housing 110. Accordingly, heat may be prevented from raising the temperature of housing 10 itself and from re-entering CCD cavity 111.

It will be appreciated that the high-efficiency exemplary designs of FIGS. 1 and 3 allow for the use of a smaller, less expensive TEC 130 and associated power supply (not shown) than would otherwise be required.

As previously discussed, suitable material for various portions of housing 110 may be selected as a function of thermal characteristics and heat transfer design considerations. For example, from a heat transfer perspective, an insulator such as epoxy-glass laminate 118 (or other insulating material such as various ceramics) may be suitable to insulate CCD cavity 111. In some embodiments employing epoxy-glass insulation, this laminate may be porous; in fact all interfaces between such an insulating laminate and transfer plate 180 (i.e., mount for hot side 131 of TEC 130) may be porous. In some instances, such porosity may eventually lead to moisture migrating into cavity 111. As noted generally above, such moisture contamination may degrade the imaging capabilities of CCD 199, and may potentially damage CCD 199 or other circuitry 198 within cavity 111.

In accordance with the embodiments illustrated and described above with reference to FIGS. 1 and 3, the structural arrangement and functional design of apparatus 100 may generally utilize a type of conformal coating (not shown) applied to the entire composite assembly (i.e., transfer plate 180, laminate materials 118, and aluminum 119 materials employed for housing 110) or selected portions thereof. In some embodiments, for example, epoxy-laminate 118 or an insulating structure of similar material and transfer plate 180 may be bolted, welded, fused, adhered, or otherwise joined, coupled, or attached prior to or in conjunction with application of a conformal coating and sealing layer; these two components, and the junction therebetween, may be coated and sealed with a conformal coating as set forth above. The coating process may remove moisture from, and prevent moisture from penetrating, the materials selected for the various components of housing 110, and additionally may seal exposed surfaces and the component interfaces.

In particular, such a coating may seal (i.e., provide an environmentally tight vapor or moisture barrier for) epoxy-laminate portion 118, transfer plate 180, and the interface between these structural components. As a consequence, apparatus 100 may generally embody a low-porosity assembly configured and operative to provide optimum heat transfer. Various conformal coating materials and methods for applying same are generally known in the art. The present disclosure is not intended to be limited by the material selected for such a coating, nor by any specific techniques employed in its application.

The combination of materials in the design of housing 110 may create a thermally efficient assembly that is optimized for heat conduction, heat insulation, and minimal porosity. Accordingly, CCD 199 may be maintained at colder operating temperatures with smaller, less powerful TEC devices.

Figure 4:
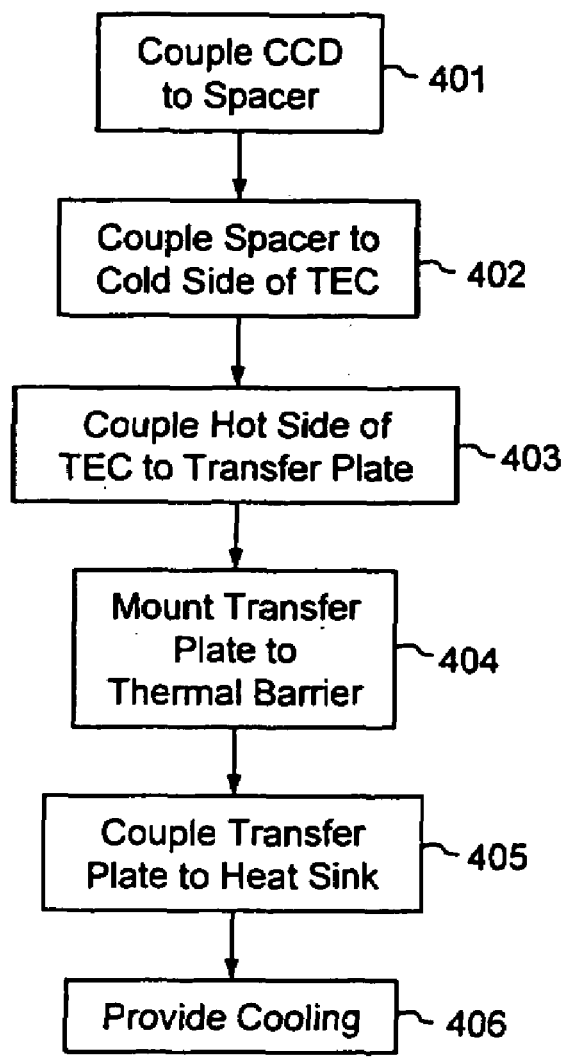
FIG. 4 is a simplified flow diagram illustrating the general operational characteristics of one embodiment of a CCD cooling method.

FIG. 4 is a simplified flow diagram illustrating the general operational characteristics of one embodiment of a CCD cooling method. As indicated at block 401, a CCD camera may be coupled to a spacer; as set forth in detail above, such a spacer may be suitably or selectively dimensioned to position the hot side of the TEC in a predetermined or selected location relative to the CCD (e.g., facilitating isolation of heat generated by the TEC), and may further be configured and operative to provide a large surface area of contact with the cold side of a TEC; maximizing this surface area of contact may facilitate heat transfer from the CCD. In that regard, the spacer may be coupled to the cold side of the TEC as indicated at block 402.

The hot side of the TEC may be coupled to a transfer plate (block 403) having appropriate heat transfer characteristics. In the embodiments illustrated and described in detail above with reference to FIGS. 1 and 3, such a transfer plate may be coupled to a heat sink (block 405) and mounted to an insulated thermal barrier (block 404) rather than to an aluminum or other heat-conductive portion of the CCD housing. As set forth above, mounting (block 404) the transfer plate to, for example, an epoxy-laminate portion of the CCD housing (or to some other thermally insulated structure or material) may prevent heating of the aluminum portion of the housing, and may minimize or eliminate re-circulation of heat generated by the TEC back to the CCD or to the cavity in which it is disposed. Coupling the transfer plate to a heat sink (block 405) provides necessary cooling of the hot side of the TEC as indicated at block 406.

The cooling operation depicted at block 406 may generally include or comprise various cooling techniques generally known in the art or developed and operative in accordance with known principles. In the exemplary embodiments, for example, cooling may include circulating (such as by fans or fan assemblies) ambient or cooled air across heat exchange fins on a heat sink. Those of skill in the art will appreciate that some applications may employ a liquid cooled heat sink, for example, or other structures and methods configured and operative to maintain the hot side of the TEC at an appropriate operating temperature.

The FIG. 4 embodiment is presented for illustrative purposes only, and is not intended to imply an order of operations to the exclusion of other possibilities. By way of specific example, the operations depicted at blocks 401 and 402 may be combined, for instance, or a spacer may be omitted substantially as set forth in detail above (i.e., in some structural arrangements, the CCD may be coupled directly to the cold side of the TEC). Additionally, a method such as depicted in FIG. 4 may further comprise selectively applying a conformal coating to the transfer plate, the thermal barrier, the interface between those components, or some combination thereof. As set forth above, such a coating may provide an environmentally tight moisture barrier preventing degradation of imaging characteristics and damage to electrical components.

Those of skill in the art will appreciate that the particular sequence in which the operations depicted at blocks 401-406 are conducted may be influenced by, among other factors, the functionality and structural configuration of a particular CCD apparatus, the intended operational characteristics of the apparatus, or both.

The present invention has been illustrated and described in detail with reference to particular embodiments by way of example only, and not by way of limitation. Those of skill in the art will appreciate that various modifications to the exemplary embodiments are within the scope and contemplation of the present disclosure.

The invention claimed is:

1. A method of cooling a charge-coupled device; said method comprising:
    coupling said charge-coupled device to a cold side of a thermoelectric cooling device;
    coupling a hot side of said thermoelectric cooling device to a transfer plate;
    mounting said transfer plate to a thermal barrier, said thermal barrier defining a cavity thermally isolated from said transfer plate, said cavity being adapted to house said charge-coupled device; and
    coupling said transfer plate to a heat sink.

2. The method of claim 1 further comprising interposing a spacer between said charge-coupled device and said cold side of said thermoelectric cooling device.

3. The method of claim 2 wherein said interposing comprises selectively dimensioning said spacer to maximize a surface area of contact between said charge-coupled device and said cold side of said thermoelectric cooling device.

4. The method of claim 2 wherein said interposing comprises selectively dimensioning said spacer to position said hot side of said thermoelectric cooling device in a predetermined location relative to said charge-coupled device.

5. The method of claim 1 further comprising selectively applying a conformal coating to at least one of said transfer plate, said thermal barrier, and an interface between said transfer plate and said thermal barrier.

6. The method of claim 5 wherein said selectively applying comprises providing an environmentally tight moisture barrier with said conformal coating.

7. The method of claim 1 further comprising cooling said hot side of said thermoelectric cooling device.

8. The method of claim 7 wherein said cooling comprises transferring heat generated by said thermoelectric cooling device from said charge-coupled device.

9. The method of claim 1 wherein said mounting comprises attaching said transfer plate to an epoxy laminate material.

10. The method of claim 1 wherein said mounting comprises isolating heat generated by said thermoelectric cooling device from said charge-coupled device.

11. An apparatus comprising:
    a charge-coupled device mounted in a housing, said housing including a thermal barrier and a cavity for mounting said charge-coupled device;
    a thermoelectric cooling device having a cold side and a hot side; said cold side coupled to said charge-coupled device;
    a heat sink; and
    a transfer plate coupling said hot side of said thermoelectric cooling device to said heat sink in a heat transfer relationship; said transfer plate mounted to said thermal barrier such that heat transfer between said thermoelectric cooling device and said housing is inhibited.

12. The apparatus of claim 11 further comprising a spacer interposed between said charge-coupled device and said cold side of said thermoelectric cooling device.

13. The apparatus of claim 12 wherein said spacer is selectively dimensioned to maximize a surface area of contact between said charge-coupled device and said cold side of said thermoelectric cooling device.

14. The apparatus of claim 12 wherein said spacer is selectively dimensioned to position said hot side of said thermoelectric cooling device in a predetermined location relative to said charge-coupled device.

15. The apparatus of claim 11 further comprising a conformal coating applied to at least one of said transfer plate, said thermal barrier, and an interface between said transfer plate and said thermal barrier.

16. The apparatus of claim 15 wherein said conformal coating provides an environmentally tight moisture barrier.

17. The apparatus of claim 11 wherein said thermoelectric cooling device is a Peltier cooling device.

18. The apparatus of claim 11 wherein said transfer plate is constructed of a heat-conducting metal.

19. The apparatus of claim 11 wherein said thermal barrier is constructed of an epoxy laminate material.

20. The apparatus of claim 12 wherein said spacer is constructed of a heat-conducting metal.

21. A method of cooling a charge-coupled device, said method comprising:
    providing a cavity in a housing, said cavity adapted to house said charge-coupled device;
    coupling said charge-coupled device to a cold side of a thermoelectric cooling device;
    coupling a hot side of said thermoelectric cooling device to a transfer plate;
    sealing said cavity, said sealing operable to provide a substantially environmentally-tight moisture barrier for said charged-coupled device; and
    interposing a thermal barrier between said housing and said transfer plate wherein said interposing comprises isolating heat generated by said thermoelectric cooling device from said charged-coupled device.

22. The method of claim 21 further comprising interposing a spacer between said charge-coupled device and said cold side of said thermoelectric cooling device.

23. The method of claim 22 wherein said interposing spacer between said charge-coupled device and said cold side of said thermoelectric cooling device comprises selectively dimensioning said spacer to maximize a surface area of contact between said charge-coupled device and said cold side of said thermoelectric cooling device.

24. The method of claim 22 wherein said interposing spacer between said charge-coupled device and said cold side of said thermoelectric cooling device comprises selectively dimensioning said spacer to position said hot side of said thermoelectric cooling device in a predetermined location relative to said charge-coupled device.

25. The method of claim 21 further comprising cooling said hot side of said thermoelectric cooling device.

26. The method of claim 25 wherein said cooling comprises transferring heat generated by said thermoelectric cooling device from said charge-coupled device.

27. The method of claim 21 wherein said sealing comprises applying a conformal coating.

28. The method of claim 21 wherein said sealing is operable to prevent moisture from penetrating said cavity.

29. The method of claim 21 wherein said thermal barrier is constructed of an epoxy laminate material.

30. An apparatus comprising:
a housing having a cavity defined therein, said cavity operative to mount a charge-coupled device;
a thermoelectric cooling device having a cold side and a hot side, said cold side coupled to said charge-coupled device;
a heat sink;
a transfer plate coupling said hot side of said thermoelectric cooling device to said heat sink in a heat transfer relationship; and
a conformal coating, said conformal coating operable to provide a substantially environmentally tight barrier for said charge-coupled device and to inhibit penetration of said cavity by moisture.

31. The apparatus of claim 30 further comprising a spacer interposed between said charge-coupled device and said cold side of said thermoelectric cooling device.

32. The apparatus of claim 31 wherein said spacer is selectively dimensioned to maximize a surface area of contact between said charge-coupled device and said cold side of said thermoelectric cooling device.

33. The apparatus of claim 31 wherein said spacer is selectively dimensioned to position said hot side of said thermoelectric cooling device in a predetermined location relative to said charge-coupled device.

34. The apparatus of claim 30 wherein said thermoelectric cooling device is a Peltier cooling device.

35. The apparatus of claim 30 wherein said transfer plate is constructed of a heat-conducting metal.

36. The apparatus of claim 30 further comprising a thermal barrier interposed between said housing and said transfer plate.

37. The apparatus of claim 36 wherein said thermal barrier is constructed of an epoxy laminate material.

38. The apparatus of claim 36 wherein said thermal barrier is interposed such that heat generated by said thermoelectric cooling device is substantially isolated from said charged-coupled device.

* * * * *